United States Patent [19]

Hibino

[11] Patent Number: 5,894,222

[45] Date of Patent: Apr. 13, 1999

[54] BATTERY TESTING METHOD FOR INDIVIDUALLY TESTING SECONDARY BATTERIES BY CHARGING AND DISCHARGING THE BATTERIES

[75] Inventor: Satoshi Hibino, Gifu, Japan

[73] Assignee: Sanyo Electric Co., Ltd., Moriguchi, Japan

[21] Appl. No.: 08/606,847

[22] Filed: Feb. 26, 1996

[30] Foreign Application Priority Data

Feb. 28, 1995 [JP] Japan .................................. 7-067062

[51] Int. Cl.$^6$ .................................................. G01N 27/26
[52] U.S. Cl. ........................ 324/434; 324/427; 324/433; 320/48
[58] Field of Search .................................. 324/426, 427, 324/433, 434, 435; 320/48, 14, 19; 340/636; 364/550, 551.01, 481

[56] References Cited

U.S. PATENT DOCUMENTS

| | | | |
|---|---|---|---|
| 4,590,430 | 5/1986 | Vandenberghe et al. | 324/427 |
| 5,537,390 | 7/1996 | Horiba et al. | 320/48 X |
| 5,543,245 | 8/1996 | Andrieu et al. | 324/434 X |

FOREIGN PATENT DOCUMENTS 4-334935  11/1992  Japan .

*Primary Examiner*—Maura K. Regan
*Attorney, Agent, or Firm*—Armstrong, Westerman, Hattori, McLeland & Naughton

[57] ABSTRACT

A method of testing the electrical capacity of a plurality of secondary batteries connected to a load. The battery testing method reduces the time during which the entire electrical capacity of the secondary batteries remains low. In the case of secondary batteries which are made up of a nickel cadmium battery cell, the testing method prevents a memory effect from arising in the batteries. Using the battery testing method, the secondary battery is forcibly discharged, whereby the characteristics of the battery resulting from the discharge are tested. During the test, the secondary battery to be tested is discharged when the other secondary batteries are charged to saturation. In the case of the nickel cadmium secondary batteries, the batteries are fully discharged. The electrical capacity of the secondary battery is checked by measuring the time that elapses before the secondary battery has completely discharged.

36 Claims, 3 Drawing Sheets

BATTERY TESTING METHOD FOR INDIVIDUALLY TESTING SECONDARY BATTERIES BY CHARGING AND DISCHARGING THE BATTERIES

BACKGROUND OF THE INVENTION

1. Field of the Invention

The present invention relates to a method of testing a secondary battery, particularly a secondary battery such as a lead storage battery or a nickel cadmium battery cell.

2. Description of the Related Art

Equipment, such as communications equipment, which is required to operate during a power outage, is provided with an UPS (uninterruptible power supply). As a result, the operation of the equipment is ensured even in the event of a power failure.

The UPS uses a lead storage battery or a nickel cadmium battery cell as a secondary battery. The lead storage battery has superior economy and energy efficiency when it is charged and discharged, and it is also easy to handle. Because of these advantages, it is widely used. Particularly, the lead storage battery is used in an UFS having large capacity. On the other hand, the nickel cadmium battery cell has long life and superior overcharge and overdischarge characteristics. Further, it is easy to maintain such a battery cell. For these reasons, it is widely used in compact equipment.

Particularly in the case of business equipment, it is commonly practiced to periodically replace the battery with a new one so as to ensure predetermined electrical capacity, because the secondary battery has an indefinite life span.

The electrical capacity of a plurality of lead storage batteries attached to the UPS is tested by discharging the batteries in parallel and by measuring resultant discharge characteristics. Unless predetermined electrical capacity is obtained, the batteries will be replaced with new ones. This test is intended to ensure continuous use of the batteries by checking them in a Predetermined manner. Because the lead storage battery has unstable characteristics, due to the fact that it utilizes a chemical reaction, it is difficult to continuously assure the initial performance of the battery.

The battery test is carried out in the following manner:

Specifically, one of the plurality of lead storage batteries connected in parallel to a load is discharged, and that battery is then recharged. The discharging of each of the batteries is started at a slightly different time, and the thus discharged batteries are respectively recharged. The electrical capacity of the battery is checked by means of the discharge characteristics of each battery obtained as a result of the test. More specifically, as shown in FIGS. 1a–1c, given that a lead storage battery X and a lead storage battery Y are connected together, the lead storage battery X is discharged between a point in time "a" and a point in time "b". Then, the charging of the lead storage battery X is started from the point in time "b" and is completed at a point in time "d". On the other hand, the discharging of the lead storage battery Y is started at the point in time "b" and is finished at the point in time "c". The recharging of the lead storage battery Y is then started at the point in time "c" and is finished at a point in time "e".

The periodic replacement of the secondary battery may result in the waste of a usable battery and the unnecessary replacement of the battery. Therefore, it is desired that the battery judged as still being usable by a predetermined test continue to be used.

According to the above described conventional method, a lead storage battery is charged after having been discharged. However, in this method, the discharging of another battery is started before the charging of the current lead storage battery has been fully completed. As can be seen from total electrical capacity shown in FIG. 1c, the electrical capacity of the lead storage battery continues to drop over a long period of time, which makes it difficult to ensure predetermined electrical capacity.

In the case of a battery using a nickel electrode such as a nickel cadmium battery cell or a nickel hydrogen battery cell, a so-called memory effect, which produces a two-stage discharge curve, occurs when the battery is rapidly discharged after having been repetitively charged and discharged by only small amounts. If the above described lead storage battery testing method is applied to a battery such as a nickel cadmium battery using a nickel electrode, predetermined electrical capacity of the battery might not be obtained as a result of the memory effect.

SUMMARY OF THE INVENTION

The present invention is conceived in view of the previously mentioned drawbacks in the prior art, and the object of this invention is to provide a method of testing a secondary battery capable of reducing the time period during which the electrical capacity of the battery continues to drop. Particularly, the object of the present invention is to provide a battery testing method capable of preventing a memory effect from arising in a nickel cadmium battery cell.

According to one aspect of the present invention, these objects are achieved by a battery testing method for checking the electrical capacity of a plurality of secondary batteries connected to a load, the method comprising the step of:

starting the discharging of a secondary battery to be tested when the other secondary battery is charged to saturation.

According to this battery testing method, the secondary battery to be checked is discharged when the other secondary battery is charged to saturation. The discharging of the secondary battery to be checked is not carried out if another secondary battery is in the course of being charged or discharged. Therefore, it is possible to reduce the time period during which the electrical capacity of the overall secondary batteries drops. Even if a power failure occurs during the course of discharging the secondary battery, it is possible for the secondary batteries to ensure as large an electrical capacity as possible.

According to another aspect of the present invention, there is provided a battery testing method for testing the electrical capacity of a plurality of secondary batteries connected to a load by forcibly discharging the secondary batteries individually, the method comprising:

a first discharge step of testing one secondary battery by discharging that secondary battery and by detecting the characteristics of the secondary battery resulting from the discharge;

a recharge step of recharging the discharged secondary battery after the first discharge step; and a second discharge step of testing another secondary battery by discharging that secondary battery after the recharging of the previous secondary battery has been completed in the recharge step.

If another secondary battery is in the course of being charged or discharged, the discharging of a secondary battery to be checked is not carried out. Therefore, it is possible to reduce the time period during which the electrical capacity of the Entire secondary batteries drops. Even if a power failure occurs during the course of discharging the secondary batteries, it becomes possible for the secondary batteries to ensure as large an electrical capacity as posS ible.

According to the battery testing method, the test of the secondary battery is carried out by detection of the characteristics of the secondary battery obtained after it has been discharged. Further, according to the battery testing method of the present invention, the secondary battery to be checked is completely discharged. As a result, it is possible to prevent the occurrence of a memory effect which poses problems for the nickel cadmium battery cell. When the secondary battery is completely discharged, the time that elapses before the secondary battery is fully discharged is checked.

According to still another aspect of the present invention, there is provided a method for testing the electrical capacity of a plurality of secondary batteries connected to a load by forcibly discharging the secondary batteries individually, the method is characterized in that the characteristics of each of the secondary batteries are tested at a different time by detecting the characteristics of the secondary battery obtained when it is discharged.

BRIEF DESCRIPTICN OF THE DRAWINGS

DESCRIPTION OF THE PREFERRED EMBODIMENTS

With reference to the accompanying drawings, preferred embodiments of the present invention will now be described.

A secondary battery testing method of the present invention will be carried out in the manner as will be described below. An UPS (uninterruptible power supply) A is equipped with a battery testing circuit to be used in testing a battery, and it has a circuit configuration as shown in FIG. 2.

Figure 1A:
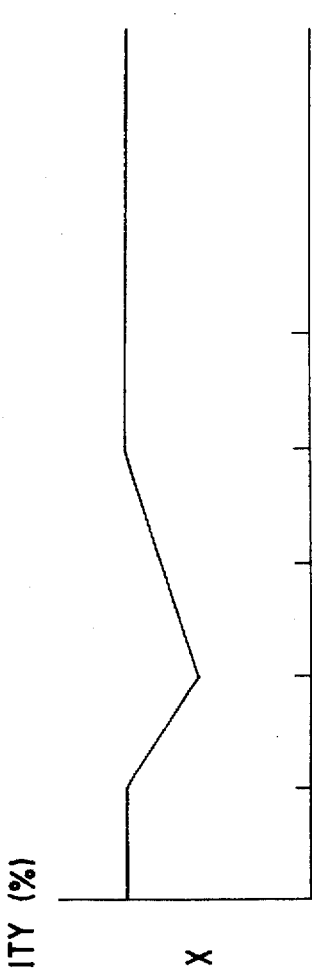
FIGS. 1a to 1c are plots explaining a conventional battery testing method and showing the relationship between electrical capacity and time.
Figure 1B:
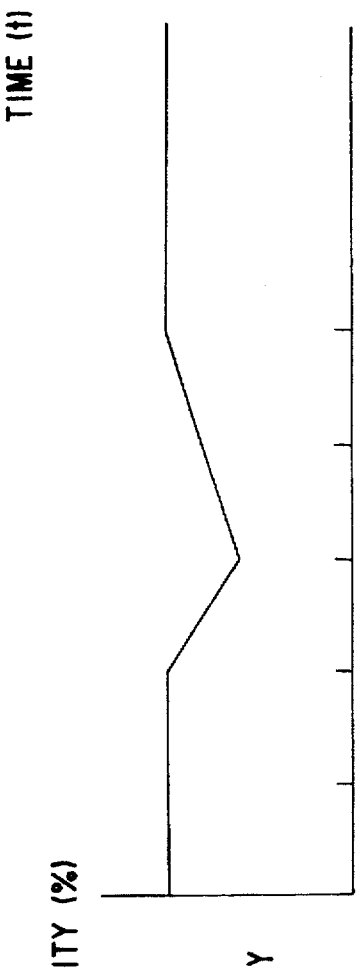
Figure 1C:
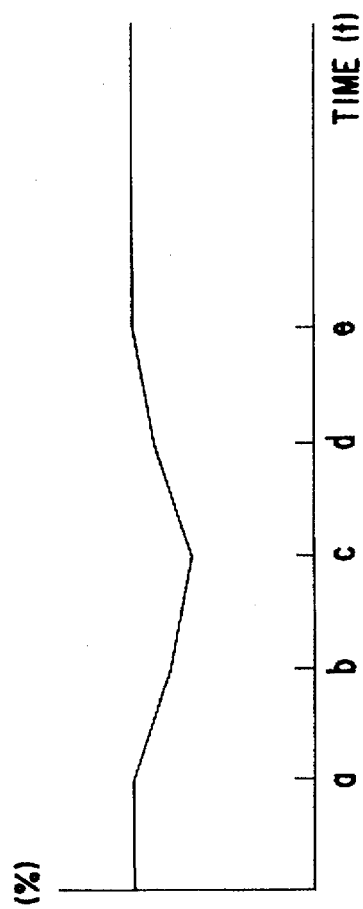
Figure 2:
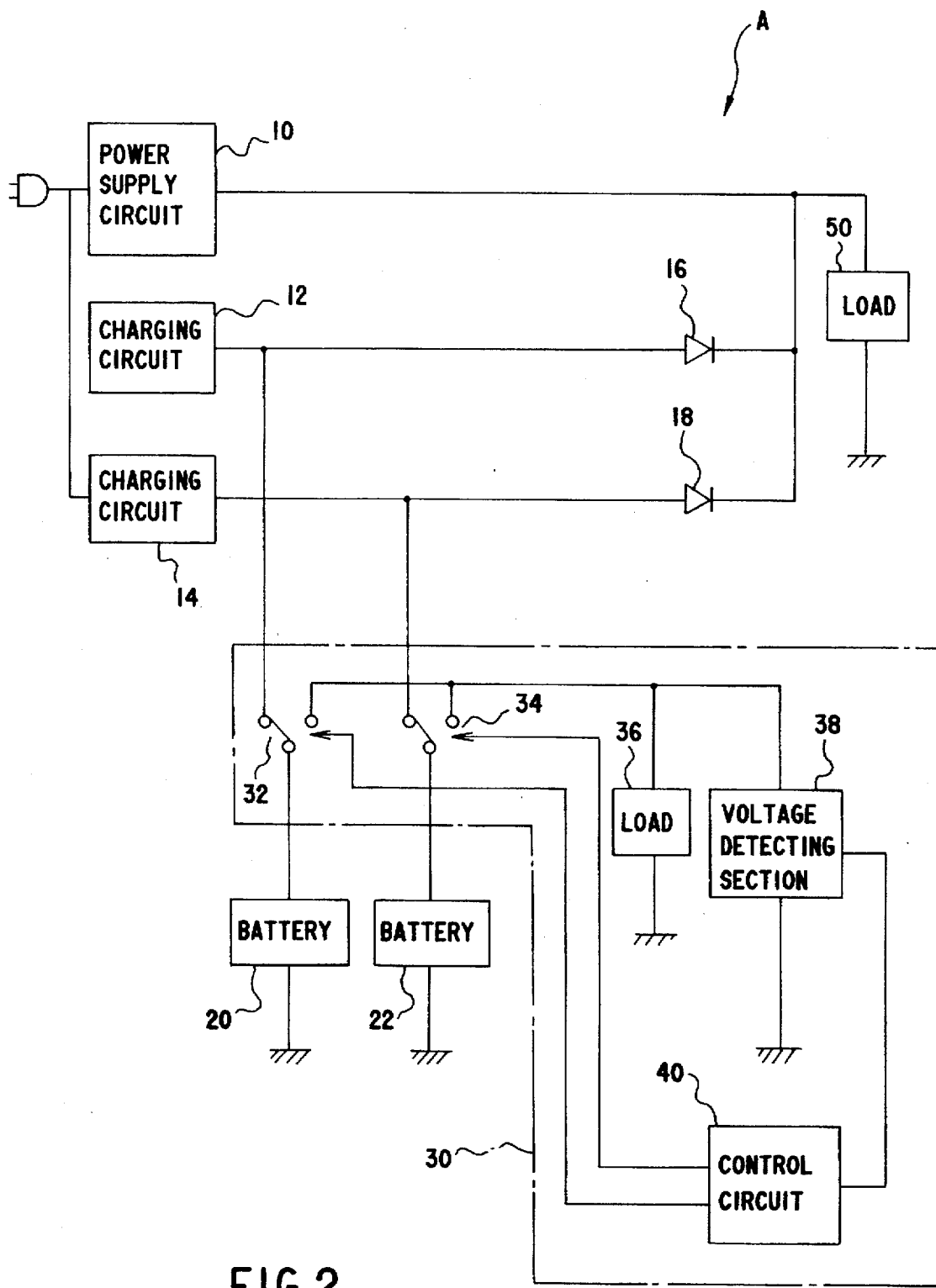
FIG. 2 is a block diagram showing an UPS equipped with a battery testing circuit which is used for a battery testing method according to one embodiment of the present invention.

The UPS A shown in FIG. 2 is provided with a power supply circuit 10 which feeds electrical power to a load 50. A charging circuit 12 connected in series with a rectifying element 16 and a charging circuit 14 connected in series with a rectifying element 18 are each connected in parallel with the power supply circuit 10. A secondary battery 20 is connected between the charging circuit 12 and the rectifying element 16 via a switch 32, and a secondary battery 22 is connected between the charging circuit 14 and the rectifying element 18 via a switch 34. These secondary batteries 20 and 22 are to be tested.

A load 36 for discharging purposes is further connected to the switches 32 and 34. A voltage detecting section 38 is connected to the switches 32 and 34 and the load 36 in order to detect a voltage applied to the load 36. A control circuit 40 is connected to the voltage detecting circuit 38 and the switches 32 and 34. In the above mentioned circuit configuration, a battery testing circuit 30 is made up of the switches 32 and 34, the load 36, the voltage detecting section 313, and the control circuit 40.

The in-use operation of the UPS A having the above described configuration will now be described. Upon receipt of utility power, the power supply circuit 10 feeds electrical power to the load 50. The charging circuits 12 and 14 charge the secondary batteries 20 and 22. Further, the rectifying elements 16 and 18 prevent the occurrence of unwanted charge and discharge between the secondary batteries 20 and 22, as well as supplying an electrical current to the load 50 in the event of a power failure.

The operation of the battery testing circuit 30 for testing the secondary batteries 20 and 22 will now be described.

Figure 3A:
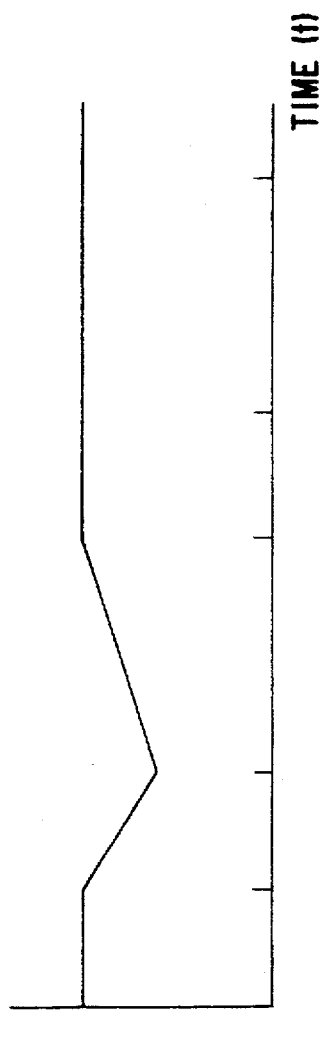
FIGS. 3a to 3c are plots explaining the battery testing method according to the embodiment of the present invention and showing the relationship between electrical capacity and time.
Figure 3B:
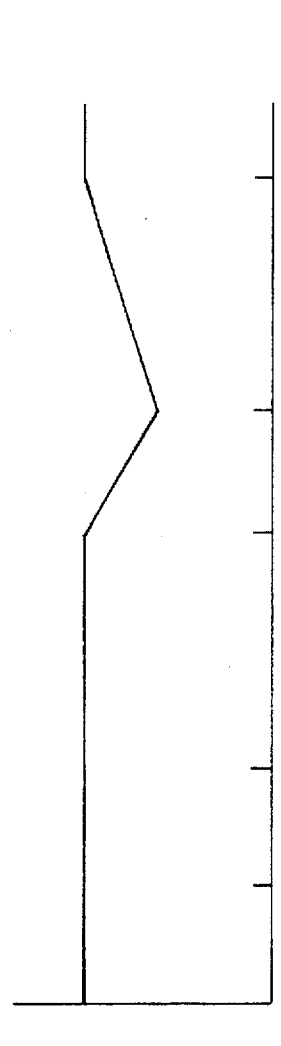
Figure 3C:
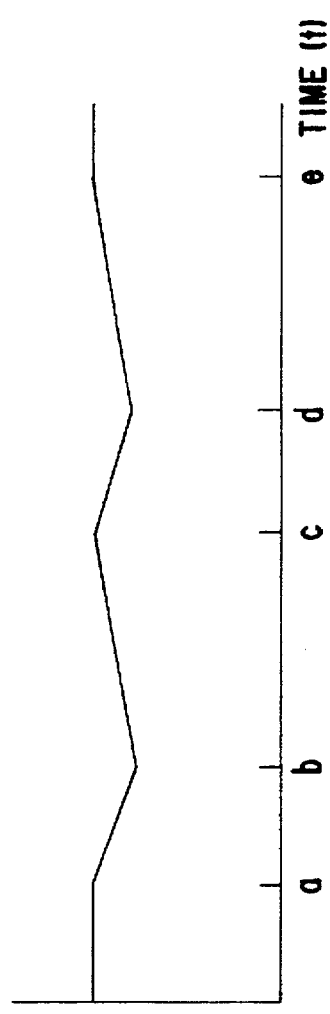

With reference to FIGS. 3a to 3c, an explanation will be given of the case where the secondary batteries 20 and 22, which are lead storage batteries, are tested by the battery testing circuit 30. To begin with, any one of the secondary batteries 20 and 22 is discharged. For example, to discharge the secondary battery 20, the switch 32 is operated to connect the battery to the load 36 at a point in time "a". Since the secondary battery 20 is a load storage battery cell, it does not fully discharge. After the secondary battery 20 has discharged until a point in time "b", the switch 32 is again operated to connect the battery to the load 50, whereby the secondary battery 20 is charged. As shown in FIG. 3a, the secondary battery 20 is charged to saturation at a pcint in time "c".

The electrical capacity of the secondary battery 20 is tested by checking the relationship between the discharging time and the voltage applied to the load 36 while it is discharging, namely, the characteristics of the secondary battery 20 obtained while it is discharging. In other words, it may be possible to check a voltage drop caused by the discharging of the battery within a predetermined period of time or to check the discharging time that elapses before a certain voltage is attained. If a predetermined electrical capacity is riot obtained from the secondary battery 20 as a result of the test, that secondary battery 20 will be replaced with a new one. It should be replaced while the other secondary battery 22 is charged to saturation.

At the point in time "c" at which the secondary battery 20 has been charged to saturation, the switch 34 connected to the secondary battery 22 is operated to connect to the load 36. As a result, the secondary battery 22 discharges until the point in time "d". As with the secondary battery 20, the secondary battery 22 is recharged, and then it is tested. This secondary battery 22 is charged to saturation at a point in time "a" shown in FIG. 3b. In the same manner as in the secondary battery 20, this battery 22 also does not fully discharge.

The relationship between the discharging time and the voltage applied to the load 36 while the secondary battery 22 is discharging is checked by the control circuit 40, whereby the electrical capacity of the secondary battery 22 is tested. The secondary battery 22 is replaced as required.

In the above descriptions, the discharging of the secondary battery 22 is started when the secondary battery 20 has been charged to saturation. However, it may be started at any desired point in time so long as the charging of the secondary battery 23 has already been completed.

According to the above described testing method, another secondary battery is discharged after one secondary battery has been fully charged. FIG. 3c shows the total electrical capacity of the two secondary batteries. As can be seen from this drawing, the electrical capacity of the batteries remains low for a shorter period of time. It becomes possible to ensure as large an electrical capacity as possible even if a power failure occurs while the battery is discharging. A!3 a consequence, adverse influences on each equipment which receives power supply can be reduced. Periodic measurement of the electrical capacity of a secondary battery makes it possible to ascertain the state of deterioration of the battery and a period of time required to feed an electrical current to a load at the time of a power failure, and to thus manage the timing of the replacement of the battery. Accordingly, it becomes possible to prevent unnecessary replacement of the battery.

An explanation will now be given of the case where the secondary batteries 20 and 22, which are nickel cadmium battery cells, are tested by the battery testing circuit 30. As with the previous case, the secondary batteries 20 and 22, which are nickel cadmium battery cells, are tested in such a way that the discharging of another secondary battery is started after the charging of one secondary battery has been completed. This case is different from the previous case only in that the batteries discharge completely.

Turning again to FIG. 2, the Switch 32 is first switched so as to connect to the load 36. The discharging of the secondary battery 20 is started, and it is continued until the secondary battery 20 completely discharges. The voltage detecting section 38 monitors whether or not the secondary battery 20 has fully discharged. Specifically, the time that elapses before the secondary battery 20 has completely discharged is checked by the control circuit 40, whereby the electrical capacity of the secondary battery 20 is tested. After the completion of the test, the charging of the secondary battery 20 is carried out. The secondary battery 20 will be replaced if it is judged as requiring replacement as a result of the test.

After the secondary battery 20 has been fully charged, the switch 34 is switched to the load 36 to discharge the secondary battery 22. The time that elapses before the secondary battery 22 has fully discharged is measured, whereby the electrical capacity of the secondary battery 22 is tested. Subsequently, the secondary battery 22 is charged. If it is judged that the battery should be replaced with new one, as a result of the test, the secondary battery 22 will be replaced.

Each of the secondary batteries may be discharged at any time so long as the other secondary battery has been fully charged. For example, given that a secondary battery is tested twice a year, it is desirable that one secondary battery be tested in January and June and the other secondary battery be tested in April and September.

As a result of the testing of the nickel cadmium battery cell, another secondary battery is discharged after one secondary battery has been fully recharged in the same manner as the previously mentioned batteries. This makes it possible to reduce the time period during which the electrical capacity of the batteries remains low. It also becomes possible to ascertain the period of time required to feed an electrical current to the load at the time of a power failure, to manage the timing of the replacement of the battery, and to prevent unnecessary replacement of the battery. In the case of the secondary battery consisting of a nickel cadmium battery, the secondary battery fully discharges. As a result, the memory effect, which poses a problem for the nickel cadmium battery, can be prevented. Therefore, the electrical capacity of the secondary battery can be fully utilized.

As a matter of fact, complete discharge of the secondary battery is impracticable. In practice, a nickel cadmium storage cell usually having a voltage of 1.2 V is gradually discharged, and it is assumed to have fully discharged if the voltage of the nickel cadmium storage cell has dropped to as low as 0.8 V.

Although the above descriptions relate to the method of testing the nickel cadmium battery cell, this battery testing method is applicable to other types of battery.

Further, the previously described battery testing method, in which the secondary battery is discharged while another secondary battery is charged to saturation, is applicable to other types of secondary battery as well as to the above mentioned lead storage battery and nickel cadmium battery cell.

The above embodiments are directed to the case of two secondary batteries, as shown in FIG. 2. The test is carried out in the same manner as previously mentioned even in the case of three or more secondary batteries being connected together. Specifically, a secondary battery to be tested is charged after having been discharged. After the charging of that secondary battery has been completed, another secondary battery is discharged.

The UPS that has the above described circuit configuration and the two nickel cadmium secondary battery cells 20 and 22 can be used, for example, in a base station of a PHS (personal handy phone system). Such a PHS is designed so as to enable a cordless receiver for domestic use to be used outside the house by means of a digital transmission system. The PHS enables phone calls at an inexpensive call charge, and in the future it is also expected to enable phone calls in areas outside the areas in which conventional handy phones can currently communicate. As a result of the use of the UPS employing nickel cadmium battery cells in a base station, the base station can be reduced in size and weight. This makes it easy to install the base station anywhere.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to those who are skilled in the art.

What is claimed is:

1. A battery testing method of individually checking the electrical capacity of a plurality of secondary batteries connected to a load, the method comprising the steps of:

a first discharging step of discharging one first secondary battery;

a first testing step of testing the electrical capacity of the first secondary battery by detecting the voltage characteristics of the first secondary battery obtained when the first secondary battery is discharged in the first discharging step;

a recharging step of recharging the thus-discharged first secondary battery after the first discharging step;

a second discharging step of discharging a second secondary battery after the first secondary battery has been fully recharged in the recharging step; and a second testing step of testing the electrical capacity of the second secondary battery by detecting the voltage characteristics of the second secondary battery obtained when it is discharged in the second discharging step.

2. The battery testing method as recited in claim 1, wherein the second secondary battery is discharged when the first secondary battery is in saturation.

3. The battery testing method as recited in claim 1, wherein the discharging operation in the second discharging step is started at a time when the first secondary battery is fully charged to saturation in the recharging step.

4. The battery testing method as recited in claim 1, wherein the electrical capacity of each of the first and second secondary batteries to be tested is checked by the relationship between a voltage and a discharging time of each of the first and second secondary batteries to be tested.

5. The battery testing method as recited in claim 1, wherein both the first and second secondary batteries are fully discharged.

6. The battery testing method as recited in claim 2, wherein the electrical capacity of each of the first and second secondary batteries to be tested is checked by the relationship between a voltage and a discharging time of each of the first and second secondary batteries to be tested.

7. The battery testing method as recited in claim 2, wherein both the first and second secondary batteries are fully discharged.

8. The battery testing method as recited in claim 3, wherein the electrical capacity of each of the first and second secondary batteries to be tested is checked by the relationship between a voltage and a discharging time of each of the first and second secondary batteries to be tested.

9. The battery testing method as recited in claim 3, wherein both the first and second secondary batteries are fully discharged.

10. The battery testing method as recited in claim 4, wherein both the first and second secondary batteries are fully discharged.

11. The battery testing method as recited in claim 5, wherein the electrical capacity of each of the first and second secondary batteries is tested by checking the time period elapsing between the time when the discharge of the secondary battery to be tested is started and the time when the secondary battery to be tested is fully discharged.

12. The battery testing method as recited in claim 6, wherein both the first and second secondary batteries are fully discharged.

13. The battery testing method as recited in claim 7, wherein the electrical capacity of each of the first and second secondary batteries is tested by checking the time period elapsing between the time when the discharge of the secondary battery to be tested is started and the time when the secondary battery to be tested is fully discharged.

14. The battery testing method as recited in claim 8, wherein both the first and second secondary batteries are fully discharged.

15. The battery testing method as recited in claim 9, wherein the electrical capacity of each of the first and second secondary batteries is tested by checking the time period elapsing between the time when the discharge of the secondary battery to be tested is started and the time when the secondary battery to be tested is fully discharged.

16. The battery testing method as recited in claim 11, wherein the electrical capacity of each of the first and second secondary batteries is tested by checking the time period elapsing between the time when the discharge of the secondary battery to be tested is started and the time when the secondary battery to be tested is fully discharged.

17. The battery testing method as recited in claim 12, wherein the electrical capacity of each of the first and second secondary batteries is tested by checking the time period elapsing between the time when the discharge of the secondary battery to be tested is started and the time when the secondary battery to be tested is fully discharged.

18. The battery testing method as recited in claim 14, wherein the electrical capacity of each of the first and second secondary batteries is tested by checking the time period elapsing between the time when the discharge of the secondary battery to be tested is started and the time when the secondary battery to be tested is fully discharged.

19. A battery testing apparatus which individually tests the electrical capacity of at least first and second secondary batteries connected to a load, comprising:

a discharge load used in an electrical discharging operation;

at least first and second changeover switches connected to the at least first and second secondary batteries respectively so as, to switch between a charging circuit and the discharge load;

a voltage detecting section for detecting a voltage applied to the discharge load; and a control circuit connected between the changeover switches and the voltage detecting section which tests each of the at least first and second secondary batteries by switching the first changeover switch connected to a first secondary battery to the discharge load so as to discharge the first secondary battery, and by detecting the voltage characteristics of the first secondary battery obtained when the first secondary battery is discharged using the voltage detecting section, and subsequently tests the electrical capacity of a second secondary battery by switching the second changeover switch connected to the second secondary battery to the discharge load so as to discharge the second secondary battery after the discharged first secondary battery has been fully recharged by switching its changeover switch to the charging circuit, and by detecting the voltage characteristics of the second secondary battery using the voltage detecting section.

20. The battery tester as recited in claim 19, wherein the second changeover switch connected to the second secondary battery is switched to the discharge load so as to discharge the second secondary battery when the first secondary battery has been fully recharged.

21. The battery tester as recited in claim 19, wherein the discharge of the second secondary battery is started at a time when the first secondary battery is fully recharged to saturation.

22. The battery tester as recited in claim 19, wherein the control circuit checks the electrical capacity of each of the first and second batteries to be tested on the basis of the relationship between a voltage and a discharging time of each of the first and second secondary batteries, respectively.

23. The battery tester as recited in claim 19, wherein the control circuit fully discharges each of the first and second batteries by monitoring the voltage detecting section.

24. The battery tester as recited in claim 20, wherein the control circuit checks the electrical capacity of each of the first and second batteries to be tested on the basis of the relationship between a voltage and a discharging time of each of the first and second secondary batteries, respectively.

25. The battery tester as recited in claim 20, wherein the control circuit fully discharges each of the first and second secondary batteries by monitoring the voltage detecting section.

26. The battery tester as recited in claim 21, wherein the control circuit checks the electrical capacity of each of the first and second secondary batteries to be tested on the basis of the relationship between a voltage and a discharging time of each of the first and second secondary batteries, respectively.

27. The battery tester as recited in claim 21, wherein the control circuit fully discharges each of the first and second secondary batteries by monitoring the voltage detecting section.

28. The battery tester as recited in claim 22, wherein the control circuit fully discharges each of the first and second secondary batteries by monitoring the voltage detecting section.

29. The battery tester as recited in claim 23, wherein the control circuit tests the electrical capacity of each of the first and second secondary batteries by checking the time period elapsing between the time when the discharge of the secondary battery to be tested is started and the time when the secondary battery, to be tested is fully discharged.

30. The battery tester as recited in claim 24, wherein the control circuit fully discharges each of the first and second secondary batteries by monitoring the voltage detecting section.

31. The battery tester as recited in claim 25, wherein the control circuit tests the electrical capacity of each of the first and second secondary batteries by checking the time period elapsing between the time when the discharge of the secondary battery to be tested is started and the time when the secondary battery to be tested is fully discharged.

32. The battery tester as recited in claim 26, wherein the control circuit fully discharges each of the first and second secondary batteries by monitoring the voltage detecting section.

33. The battery tester as recited in claim 27, wherein the control circuit tests the electrical capacity of each of the first and second secondary batteries by checking the time period elapsing between the time when the discharge of the secondary battery to be tested is started and the time when the secondary battery to be tested is fully discharged.

34. The battery tester as recited in claim 28, wherein the control circuit tests the electrical capacity of each of the first and second secondary batteries by checking the time period elapsing between the time when the discharge of the secondary battery to be tested is started and the time when the secondary battery to be tested is fully discharged.

35. The battery tester as recited in claim 30, wherein the control circuit tests the electrical capacity of each of the first and second secondary batteries by checking the time period elapsing between the time when the discharge of the secondary battery to be tested is started and the time when the secondary battery to be tested is fully discharged.

36. The battery tester as recited in claim 32, wherein the control circuit tests the electrical capacity of each of the first and second secondary batteries by checking the time period elapsing between the time when the discharge of the secondary battery to be tested is started and the time when the secondary battery to be tested is fully discharged.

* * * * *